(12) United States Patent
Shi et al.

(10) Patent No.: US 9,413,464 B2
(45) Date of Patent: Aug. 9, 2016

(54) OPTOELECTRONIC ASSEMBLY FOR SIGNAL CONVERSION

(71) Applicant: Finisar Corporation, Sunnyvale, CA (US)

(72) Inventors: Wei Shi, San Jose, CA (US); Idan Mizrahi, Fremont, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 14/481,367

(22) Filed: Sep. 9, 2014

(65) Prior Publication Data

US 2015/0071643 A1 Mar. 12, 2015

Related U.S. Application Data

(60) Provisional application No. 61/875,388, filed on Sep. 9, 2013.

(51) Int. Cl.
| | | |
|---|---|---|
| *H04B 10/40* | (2013.01) | |
| *H04B 10/50* | (2013.01) | |
| *H04B 10/60* | (2013.01) | |
| *G02B 6/42* | (2006.01) | |
| *H01S 5/022* | (2006.01) | |

(52) U.S. Cl.
CPC ............. *H04B 10/40* (2013.01); *G02B 6/4204* (2013.01); *G02B 6/428* (2013.01); *H04B 10/501* (2013.01); *H04B 10/60* (2013.01); *G02B 6/4249* (2013.01); *G02B 6/4262* (2013.01); *G02B 6/4267* (2013.01); *H01S 5/02216* (2013.01); *H01S 5/02284* (2013.01)

(58) Field of Classification Search
CPC .... H04B 10/40; G02B 6/4246; G02B 6/4204; G02B 6/428; G02B 6/4262; G02B 6/4251–6/4253; H01S 5/02216; H01S 5/02284
See application file for complete search history.

(56) References Cited

U.S. PATENT DOCUMENTS

| | | | | |
|---|---|---|---|---|
| 6,353,491 | B1 * | 3/2002 | Tanaka | H04B 10/40 257/81 |
| 6,588,949 | B1 | 7/2003 | Zhou | |
| 7,239,767 | B2 * | 7/2007 | Kim | G02B 6/42 385/14 |
| 7,539,366 | B1 * | 5/2009 | Baks | G02B 6/4201 385/14 |
| 2003/0201462 | A1 * | 10/2003 | Pommer | G02B 6/4201 257/200 |
| 2004/0086011 | A1 * | 5/2004 | Bhandarkar | G02B 6/4206 372/50.21 |
| 2004/0264884 | A1 | 12/2004 | Liu | |
| 2005/0063642 | A1 * | 3/2005 | Gallup | G02B 6/4292 385/33 |
| 2006/0210234 | A1 * | 9/2006 | Shiv | B81C 1/00301 385/147 |
| 2006/0245697 | A1 * | 11/2006 | Toillon | G02B 6/4202 385/88 |
| 2010/0326714 | A1 * | 12/2010 | Fukuzono | H01L 21/4857 174/259 |
| 2011/0008053 | A1 | 1/2011 | Nguyen | |

(Continued)

*Primary Examiner* — David Payne
*Assistant Examiner* — Casey Kretzer
(74) *Attorney, Agent, or Firm* — Maschoff Brennan

(57) ABSTRACT

Aspects of the present disclosure include an optoelectronic assembly with a housing that defines a cavity and includes a first component and a glass component disposed on an opposite side of the cavity from the first component. The glass component may include a first surface and a second surface and a lens located on the first surface. An optical transmitter and/or an optical receiver may be mechanically coupled to the first component within the cavity and oriented to emit optical signals through the glass component and the lens. Conductive traces may be located on the second surface of the glass component and electrically coupled to the optical transmitter and/or the optical receiver. An electronic component may be coupled to at least one of the conductive traces.

20 Claims, 5 Drawing Sheets

(56) References Cited

U.S. PATENT DOCUMENTS

| | | | |
|---|---|---|---|
| 2011/0044696 A1* | 2/2011 | Lim | H04B 10/40 398/139 |
| 2012/0057816 A1* | 3/2012 | Krasulick | G02B 6/12 385/14 |
| 2012/0178610 A1* | 7/2012 | Hublikar | C03C 3/091 501/32 |

* cited by examiner

OPTOELECTRONIC ASSEMBLY FOR SIGNAL CONVERSION

CROSS-REFERENCE TO RELATED APPLICATION

This application claims priority to U.S. Provisional Application No. 61/875,388, filed Sep. 9, 2013 titled "OPTOELECTRONIC ASSEMBLY FOR SIGNAL CONVERSION" which is incorporated by reference in its entirety.

BACKGROUND

Light signals may be used to rapidly and reliably transmit information in a variety of applications such as fiber optic networks or computer systems.

Fiber optic networks have various advantages over other types of networks such as copper wire based networks. Many existing copper wire networks operate at near maximum possible data transmission rates and at near maximum possible distances for copper wire technology. Fiber optic networks may be used to reliably transmit data at higher rates over further distances than is possible with copper wire networks.

Computer systems employing high speed optical interconnects may provide improved performance when compared to other computers systems. The performance of some computer systems can be restricted by the rate that computer processors can access memory or communicate with other components in the computer system. The restriction can be due, in part, to the physical limitations of data interconnects such as electrical connections. For example, electrical pins with a particular size and/or surface area that may be used in electrical connections may only be capable of transmitting a specific amount of data, and in turn this may limit the maximum bandwidth for data signals. In some circumstances, such connections may result in bottlenecks when the maximum bandwidth of connections becomes a performance limiting factor. High speed optical interconnects using light signals may permit transmission of information at increased data rates to decrease or eliminate such bottlenecks.

Although light signals may be used to transmit data at increased data rates in fiber optic networks, computer systems or other applications, many electronic components use electrical signals. Accordingly, optoelectronic assemblies may be used to convert electrical signals to optical signals, convert optical signals to electrical signals, or convert both electrical signals to optical signals and optical signals to electrical signals.

The claimed subject matter is not limited to embodiments that solve any disadvantages or that operate only in environments such as those described above. This background is only provided to illustrate one exemplary technology area where some of the described embodiments may be practiced.

SUMMARY

The present disclosure generally relates to optoelectronic assemblies that: convert electrical signals to optical signals, convert optical signals to electrical signals, or convert both electrical signals to optical signals and optical signals to electrical signals.

This Summary introduces a selection of concepts in a simplified form that are further described below in the Detailed Description. This Summary is not intended to identify key features or essential characteristics of the claimed subject matter, nor is it intended to be used as an aid in determining the scope of the claimed subject matter.

In an example embodiment, an optoelectronic assembly may include a housing that defines a cavity and includes a first component and a glass component disposed on an opposite side of the cavity from the first component. The glass component may include a first surface and a second surface and a lens located on the first surface. An optical transmitter and/or an optical receiver may be mechanically coupled to the first component within the cavity and oriented to emit optical signals through the glass component and the lens. Conductive traces may be located on the second surface of the glass component and electrically coupled to the optical transmitter and/or the optical receiver. An electronic component may be coupled to at least one of the conductive traces.

In another example embodiment, an optoelectronic module may include an optoelectronic assembly and an electronic substrate to which the optoelectronic assembly is mechanically coupled. The optoelectronic assembly may include a housing that defines a cavity and includes a first component and a glass component disposed on an opposite side of the cavity from the first component. The glass component may include a first surface and a second surface and a lens located on the first surface. An optical transmitter and/or an optical receiver may be mechanically coupled to the first component within the cavity and oriented to emit optical signals through the glass component and the lens. Conductive traces may be located on the second surface of the glass component and may be electrically coupled to the optical transmitter and/or the optical receiver. At least one of the conductive traces may include a first portion located within the cavity and a second portion located outside of the cavity. An electronic component may be coupled to at least one of the conductive traces and the electronic substrate may be electrically coupled to the second portion located outside of the cavity.

Additional features and advantages will be set forth in the description which follows, and in part will be obvious from the description, or may be learned by practice of the embodiments. The features and advantages may be realized and obtained by means of the instruments and combinations particularly pointed out in the appended claims. These and other features will become more fully apparent from the following description and appended claims.

BRIEF DESCRIPTION OF THE DRAWINGS

Embodiments will be described and explained with additional specificity and detail through the use of the accompanying drawings in which.

DETAILED DESCRIPTION

Reference will now be made to the figures wherein like structures will be provided with like reference designations. The drawings are diagrammatic and schematic representations of exemplary embodiments and, accordingly, are not limiting of the scope of the claimed subject matter, and the drawings are not necessarily drawn to scale.

Light signals (which may also be referred to as "optical signals") may be used to rapidly and reliably transmit information in a variety of applications such as fiber optic networks or computer systems. Although light signals may be used to transmit data at increased data rates in fiber optic networks, computer systems or other applications, many electronic components use electrical signals. Accordingly, the following embodiments generally relate to optoelectronic assemblies that may be used to convert electrical signals to optical signals, convert optical signals to electrical signals, or convert both electrical signals to optical signals and optical signals to electrical signals. The described optoelectronic assemblies may be used in fiber optic networks, computer systems or other environments.

Some components of optoelectronic assemblies may create heat during operation. However, some of the components may have operating temperatures within a certain range that should not be exceeded so the components perform properly and/or portions of the optoelectronic assemblies are not damaged. Accordingly, heat management of optoelectronic assemblies may be useful for the optoelectronic assemblies to operate properly in various conditions. For example, heat management may be useful for high-density optoelectronic assemblies that include many components that are positioned closer together, creating relatively more heat within a smaller space.

Aspects of the optoelectronic assemblies described below may include various beneficial thermal properties to maintain the integrity of their components, increase operating lifespan, expand the range of operating conditions, and/or create new potential applications for the described optoelectronic assemblies. Furthermore, beneficial thermal properties may be useful for high-density applications of optoelectronic assemblies in which many components are provided in close proximity of one another.

Figure 1:
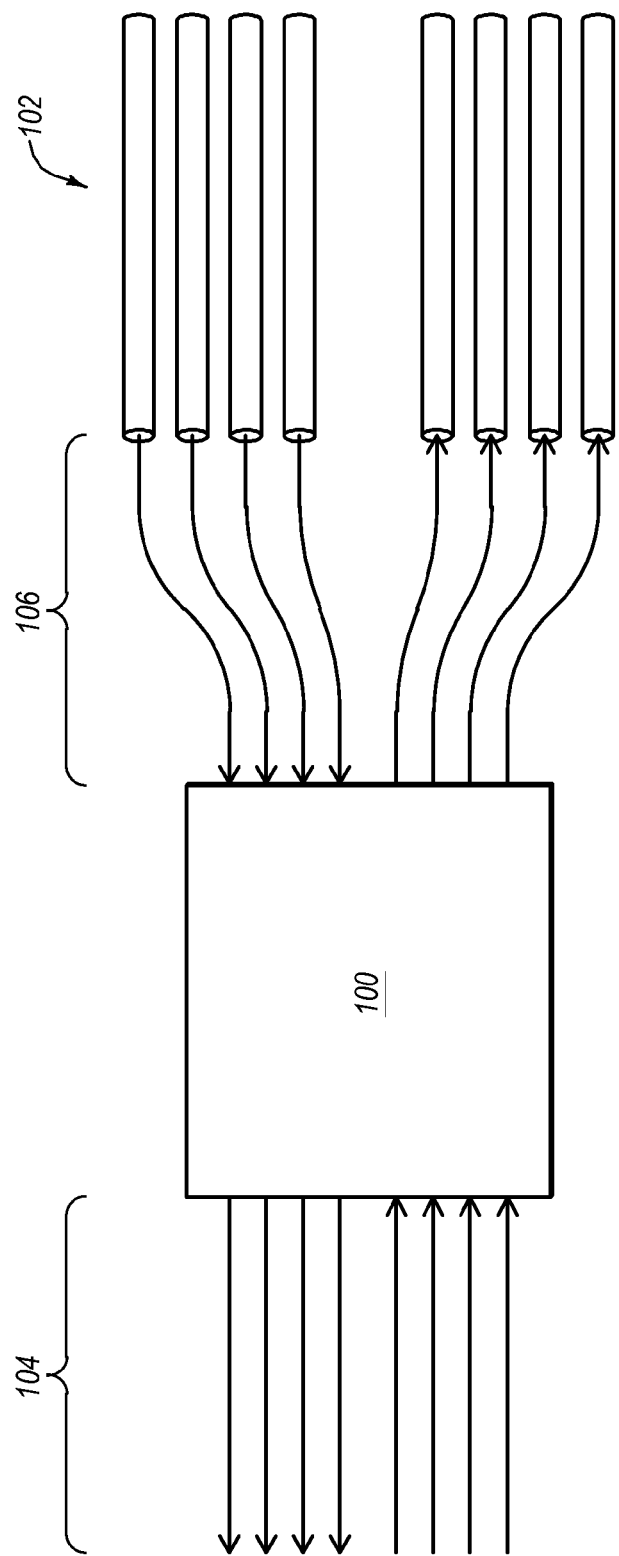
FIG. 1 is a schematic view of an example operating environment of an optoelectronic module.

FIG. 1 schematically illustrates an optoelectronic module 100 as part of a fiber optic network and in which some embodiments described herein may be implemented. The optoelectronic module 100 may convert electrical signals 104 to optical signals 106 which then travel through fiber optic cables 102 as part of a fiber optic network. Alternatively or additionally, the optoelectronic module 100 may convert optical signals 106 to electrical signals 104. The optoelectronic module 100 may be configured to receive either one or multiple electrical signals 104 and/or optical signals 106. The optoelectronic module 100 may also be configured to output either one or multiple electrical signals 104 and/or optical signals 106.

Figure 2:
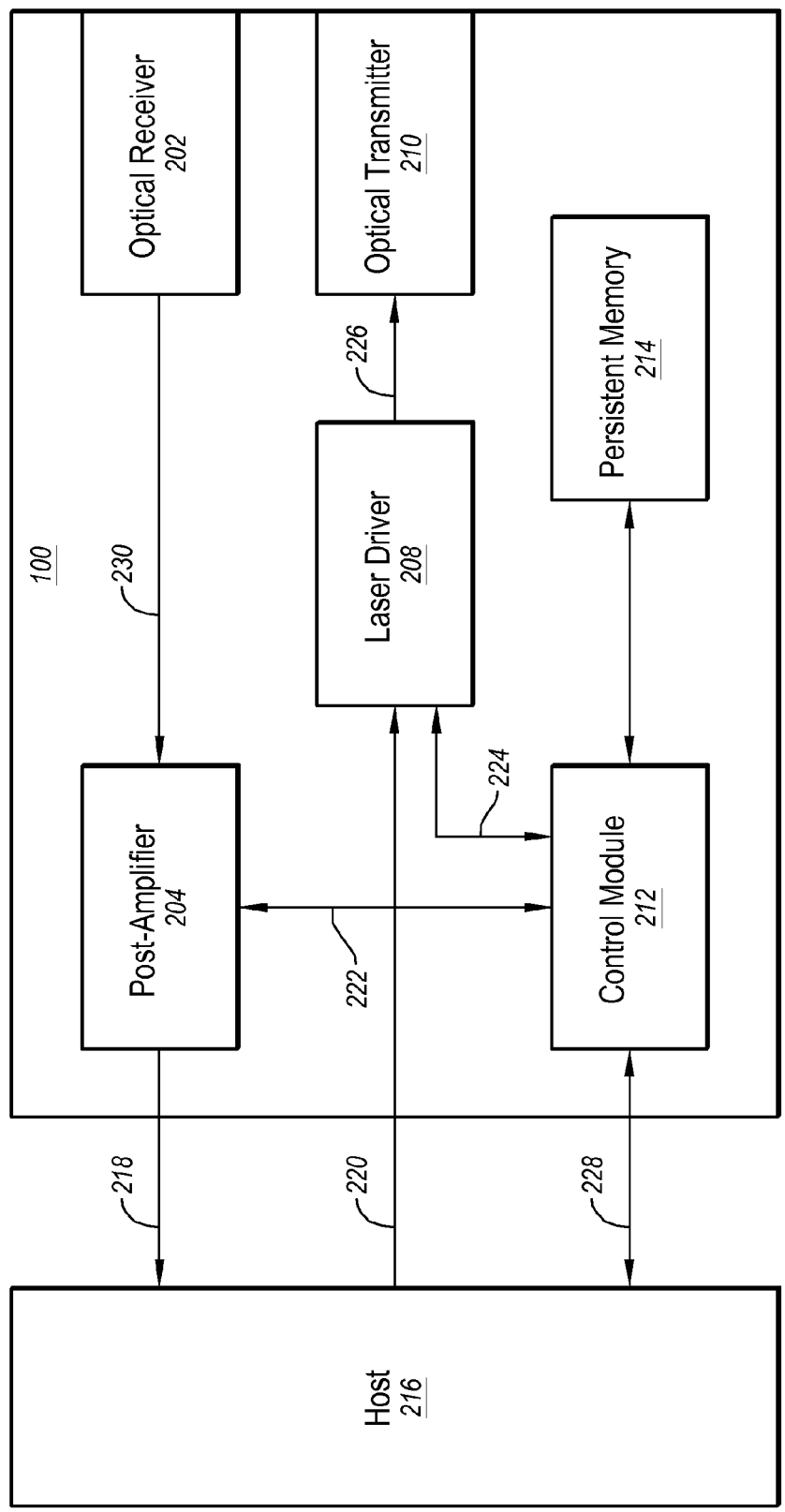
FIG. 2 is a schematic view of an example operating environment of an optoelectronic module.

FIG. 2 schematically illustrates an example embodiment of the optoelectronic module 100 of FIG. 1. In the illustrated embodiment, the optoelectronic module 100 includes an optical receiver 202, a post-amplifier 204, a laser driver 208, an optical transmitter 210, a control module 212, and a persistent memory 214. While the optoelectronic module 100 will be described in some detail, it is described by way of example only, and not by way of restricting the scope of the claimed embodiments.

In operation, the optoelectronic module 100 receives an optical signal at the optical receiver 202. The optical receiver 202 transforms the optical signal into an electrical signal. The optical receiver 202 provides the resulting electrical signal 230 to the post-amplifier 204. The post-amplifier 204 amplifies the electrical signal 230 and provides the amplified signal 218 to a host 216. The host 216 may include any computing system capable of communicating with the optoelectronic module 100, such as a media access controller ("MAC") card, a SONET framer, or the like. The optoelectronic module 100 may also receive electrical signals from the host 216 for transmission as optical signals. Specifically, the laser driver 208 may receive an electrical signal 220 from the host 216, and may drive the optical transmitter 210 to emit an optical signal. The optical transmitter 210 includes a suitable light source, such as a semiconductor laser, that is driven by a drive signal 226 that is representative of the electrical signal 220 provided by the host 216, thereby causing the light source to emit optical signals representative of the information carried in the electrical signal 220.

The behavior of the optical receiver 202, the post-amplifier 204, the laser driver 208, and the optical transmitter 210 may vary dynamically due to a number of factors. For example, temperature changes, power fluctuations, and feedback conditions may each affect the performance of these components. Accordingly, the optoelectronic module 100 may include a control module 212 which may evaluate conditions, and may adjust the operation of the optoelectronic module 100 in response to the evaluated conditions. The evaluated conditions may include environmental conditions such as temperature, and/or operating conditions such as emitted optical power and/or wavelength. The evaluated environment conditions and/or operating conditions allow the control module 212 to optimize the dynamically varying performance of the optoelectronic module 100.

The control module 212 may be operably coupled to the post-amplifier 204 as represented by arrow 222 and operably coupled to the laser driver 208 as represented by arrow 224. The control module 212 may receive information such as operating conditions from the post-amplifier 204 and/or the laser driver 208. The control module 212 may transmit control signals to the post-amplifier 204 and/or the laser driver 208. The control module 212 may optimize the operation of the optoelectronic module 100 by adjusting settings on the post-amplifier 204 and/or the laser driver 208 with the control signals.

The control module 212 may have access to the persistent memory 214, which in some embodiments includes an Electrically Erasable and Programmable Read Only Memory ("EEPROM"). Persistent memory 214 may alternately or additionally be any other non-volatile memory source. Any group of components mentioned in module 100 may be packaged together in the same package or in different packages without restriction.

The control module 212 may include a host interface 228 for communicating clock and/or data signals from the host 216 to the control module 212 and/or for communicating data from the control module 212 to the host 216. The host interface 228 may implement any one of a variety of communication protocols, including, but not limited to, I2C, MDIO, SPI, or the like or any combination thereof.

Figure 3:
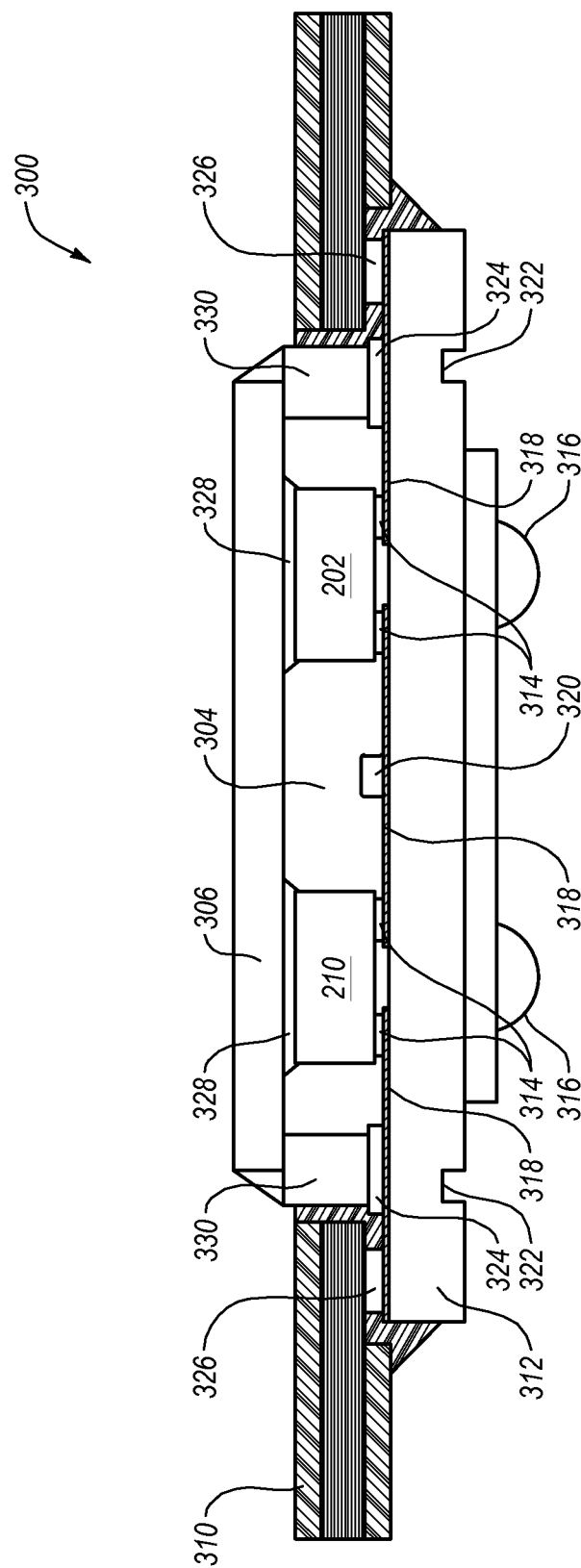
FIG. 3 is a detailed view of an example embodiment of an optoelectronic assembly.

FIG. 3 illustrates an example optoelectronic assembly 300 that may be implemented in the optoelectronic module 100 of FIGS. 1-2 and/or in other operating environments. In particular, the optoelectronic assembly 300 may include and/or correspond to one or both of the optical receiver 202 and the optical transmitter 210 of FIG. 2. Alternately or additionally, the optoelectronic assembly 300 may be analogous to, for example, a transmitter optical subassembly (TOSA), a receiver optical subassembly (ROSA), or a combination thereof.

As illustrated, the optoelectronic assembly 300 includes the optical transmitter 210 and the optical receiver 202 disposed on and/or mechanically coupled to a first component 306. The first component 306 may be spaced apart from a glass component 312 by a third component 330. The first component 306 and the glass component 312 may be substantially parallel to one another, as illustrated. The first component 306, the glass component 312, and the third component 330 may collectively form a housing of the optoelectronic assembly 300, the housing defining a cavity 304 inside which the optical receiver 202 and the optical transmitter 210 are disposed.

Although the first component 306 and the third component 330 may be discrete components, as illustrated, in other configurations the first component 306 and the third component 306 may be integrally formed with one another. For instance, the first component 306 and the third component 306 may be formed as a unitary component by molding, casting or other suitable process.

Conductive traces 318 are disposed on, formed on, and/or mechanically coupled to the glass component 312 and are electrically coupled to the optical receiver 202 and the optical transmitter 210. In these and other embodiments, at least one of the conductive traces 318 may electrically couple the optical receiver 202 to a post-amplifier, such as the post-amplifier 204 of FIG. 2, located inside or outside of the cavity 304. Analogously, at least one different one of the conductive traces 318 may electrically couple the optical transmitter 210 to a laser driver, such as the laser driver 208 of FIG. 2, located inside or outside of the cavity 304.

FIG. 3 additionally illustrates an electronic component 320 located inside of the cavity 304 and electrically coupled to at least one of the conductive traces 318. The inclusion of the electronic component 320 is merely intended to illustrate that one or more electronic components 320 may be included in the cavity 304 of the optoelectronic assembly 300. The electronic component 320 may include, but is not limited to, a capacitor, a resistor, an inductor, the post-amplifier 204, the laser driver 208, or some other circuit or circuit element.

The conductive traces 318 may extend outside of the cavity 304 and may electrically couple the optical transmitter 210, the optical receiver 202 and/or one or more of the electronic components 320 to an electronic substrate 310 or other circuitry external to the cavity 304. Optionally, an electrical coupler 326 may be provided to couple each of the conductive traces 318 to a corresponding trace in the electronic substrate 310. Each of the electrical couplers 326 may include a solder joint or any other suitable electrical coupler. Depending on the intended application, the electronic substrate 310 may include a printed circuit board (PCB), flexible PCB, rigid PCB, a ceramic substrate or any other suitable substrate.

The conductive traces 318 may be formed on or attached to the glass component 312 using any suitable wafer fabrication technology. For example, the conductive traces 318 may be formed using plating or lithograpy. The conductive traces 318 may be made of any conductive material that may be attached to or formed on the glass component. For example, the conductive traces 318 may include nickel or gold plated on copper. Any wafer fabrication techniques now known or later developed may be used to accurately control the electrical impedance with respect to the conductive traces 318.

One or more lenses 316 may be located on the glass component 312. The lenses 316 may be attached to the glass component 312 using any suitable optoelectronic fabrication techniques. Depending on the application, the lenses 316 may be actively aligned or passively aligned using suitable optoelectronic fabrication techniques. The optical transmitter 210 may be oriented to emit optical signals through the glass component 312 and one of the lenses 316. Additionally or alternatively, the optical receiver 202 may be oriented to receive optical signals through the other of the lenses 316 and the glass component 312. The lenses 316 may be configured to convey, direct and/or focus optical signals from the optical transmitter 210 and/or to the optical receiver 202. The lenses 316 may be optically transmissive surfaces such as curved surfaces (e.g. concave, or convex), planar surfaces, or a combination thereof.

The glass component 312 may include one or more etched features 322. The etched features 322 may be configured to align a waveguide to the lenses 316 and/or to the glass component 312. The waveguide may include optical fiber or any other waveguide.

The optical transmitter 210 may include a light emitting diode, a vertical cavity surface-emitting laser (VCSEL), an edge-emitting laser such as a fabry-perot laser, a distributed feedback (DFB) laser, or a distributed Bragg reflector (DBR) laser, or any other suitable light source. The optical receiver 202 may include a photodiode, an avalanche photodiode, a photoresistor, a reverse biased light emitting diode, a photodetector, or any other system capable of detecting light.

The optical transmitter 210 and the optical receiver 202 may be disposed on and/or coupled to the first component 306 using any one of multiple semiconductor assembly techniques or other suitable techniques. For example, the optical transmitter 210 and the optical receiver 202 may be attached to the first component 306 with a mechanical coupler 328 such as an adhesive, a thermal adhesive, an epoxy, or other suitable mechanical coupler. The mechanical coupler 328 may also thermally couple the optical transmitter 210 and the optical receiver 202 to the first component 306 such that the first component 306 functions as a heat sink for heat generated by the optical transmitter 210 and the optical receiver 202 during operation. Alternatively or additionally, the optical transmitter 210 and the optical receiver 202 may be formed onto or otherwise coupled to the first component 306 using one or more semiconductor fabrication techniques or other suitable techniques.

In some embodiments, the first component 306 and the third component 330 may be joined, e.g., coupled, using a welding technique such as laser beam welding. The first component 306 and the third component 330 may alternately or additionally be joined with thermal epoxy, or any other suitable technique used in optoelectronic fabrication. Alternatively, the first component 306 and the third component 330 may be formed as a unitary component.

The optical transmitter 210, the optical receiver 202, or both may be electrically coupled to the conductive traces 318 using a solder joint 314 or any other suitable electrical coupler.

The glass component 312 may be mechanically coupled to one or both of the first component 306 or the third component 330 using a mechanical coupler 324. The mechanical coupler 324 may include, but is not limited to, glass frit or benzocyclobutene (BCB) epoxy. Alternatively, the mechanical coupler 324 may be formed using any suitable optoelectronics bonding technique which may include adhesive bonding, wafer bonding, direct bonding, plasma activated bonding, anodic bonding, eutectic bonding, thermocompression bonding, or reactive bonding.

The first component 306, the glass component 312 and the third component 330 may form, for example, a hermetic or semi-hermetic housing defining the cavity 304. The optical receiver 202, the optical transmitter 210 and electronic components 320 may be sealed inside of the cavity 304 (or "hermetically sealed cavity") to improve reliability of the optoelectronic module 100. Hermetic or semi-hermetic sealing may improve the reliability of optoelectronic assemblies in high temperature and/or high humidity environments. In some configurations, hermetically sealed cavities may be airtight. In some configurations, semi-hermetically sealed cavities may protect interior components from outside influences.

In some embodiments, the third component 330 may be omitted and the first component 306 may be coupled to the electronic substrate 310. In such configurations, the first component 306, the glass component 312 and the electronic substrate 330 may form a housing defining the cavity 304.

As already mentioned, in operation, the optical receiver 202 and the optical transmitter 210 may generate heat. Excess heat may adversely affect performance, lifetime, and/or other aspects of the various components that are part of the optoelectronic assembly 300. Excess heat may alternately or additionally adversely affect other electronic components near the optoelectronic assembly 300. Accordingly, embodiments of the optoelectronic assembly 300 may have various beneficial thermal properties to maintain the integrity of its components, increase operating lifespan, expand the range of operating conditions, and/or create new potential applications for the optoelectronic assembly 300. Furthermore, beneficial thermal properties may be useful for high-density applications of optoelectronic assemblies in which multiple optical receivers and/or multiple optical transmitters are provided in close proximity within the optoelectronic assembly.

In some embodiments, the first component 306 and/or the third component 330 include one or more materials with a low coefficient of thermal expansion. For example, for some applications a coefficient of thermal expansion less than 20 ppm/° C. may be considered low. In some embodiments, the first component 306 and/or the third component 330 are made of a polymer, a metal or metal alloy, such as a nickel-cobalt ferrous alloy and/or other alloys sometimes referred to as KOVAR, or a material with similar thermal properties.

In some embodiments, the mechanical coupler 328 between the optical transmitter 210 and the first component 306 and between the optical receiver 202 and the first component 306 may include thermal adhesive(s) to further facilitate heat dissipation. Thermal adhesives are designed to withstand high temperatures without melting or losing bonding. Thermal adhesives also help transfer heat between the media they attach.

Figure 4:
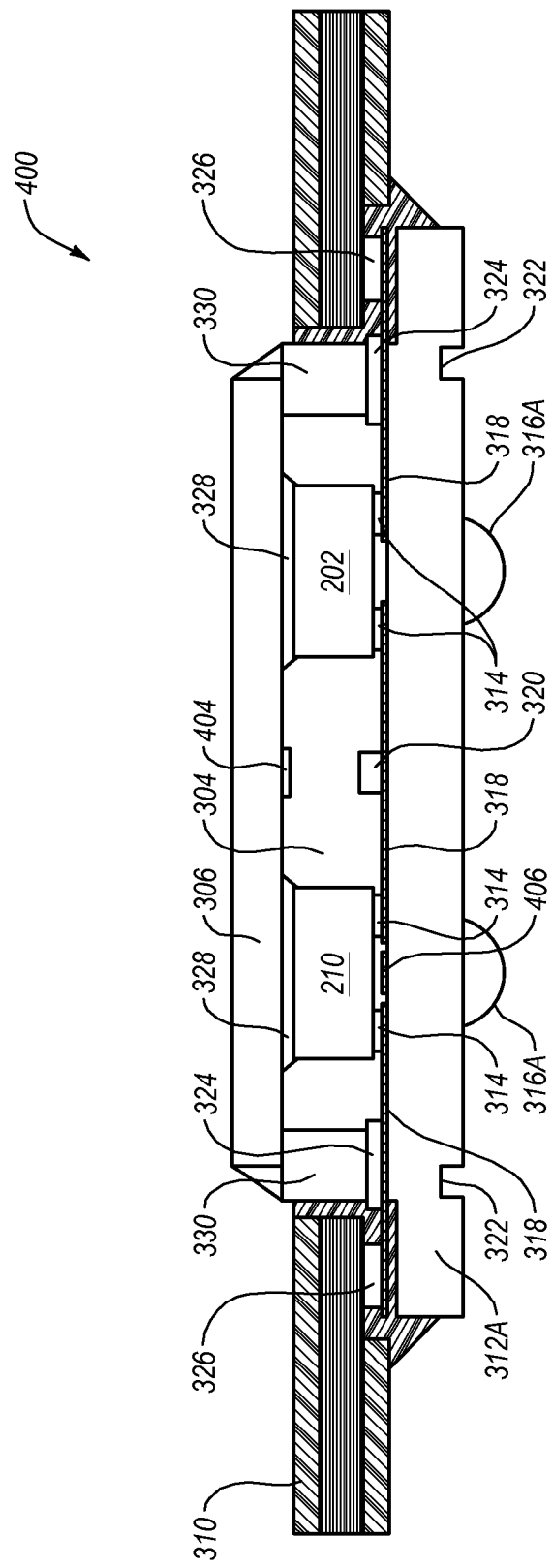
FIG. 4 is a detailed view of another example embodiment of an optoelectronic assembly.

FIG. 4 illustrates another example optoelectronic assembly 400 that may be implemented in the optoelectronic module 100 of FIGS. 1-2 and/or in other operating environments. In particular, the optoelectronic assembly 400 may include and/or correspond to one or both of the optical receiver 202 and the optical transmitter 210 of FIG. 2. The optoelectronic assembly 400 includes some components that are similar or identical to components illustrated in and described with respect to FIG. 3 and such components are identified in FIG. 4 using the same numbering. A discussion of some or all of these components may be omitted in the discussion of FIG. 4 for brevity.

As illustrated in FIG. 4, the optoelectronic assembly 400 includes a getter 404. The getter 404 may be disposed anywhere in the cavity 304. A getter 404 may include a deposit of reactive material that is placed inside a hermetic system, for the purpose of completing and maintaining the hermetic seal. The getter 404 may remove small amounts of gas from the cavity 304 when gas molecules strike the getter 404 and combine with it chemically or by adsorption. The getter 404 may include a coating applied to any surface within the cavity 304. For example, the getter 404 may be applied to a surface of the first component 306, a surface of a glass component 312A generally corresponding to the glass component 312 of FIG. 3, and/or a surface of the third component 330.

In the example of FIG. 4, the glass component 312A includes lenses 316A integrally formed therein, as compared to the example of FIG. 3 in which the lenses 316 are provided as discrete components attached to the glass component 312. Depending on the application, the lenses 316A of FIG. 4 may be actively aligned or passively aligned using suitable optoelectronic fabrication techniques.

A film 406 may be disposed in an optical path of the optical transmitter 210. For example, the film 406 may be coupled to the glass component 312A in the optical path of the optical transmitter 210 where the optical path also passes through the lenses 316A. The film 406 may be part of a waveguide, filter, polarizer or isolator. The film 406 may be configured to filter optical signals passing through the film. The film 406 may filter optical signals to selectively transmit optical signals of certain wavelengths, or to polarize optical signals by selectively transmitting optical signals of a specific polarization or to isolate optical signals such that optical signals of certain wavelengths may pass in one direction.

Figure 5:
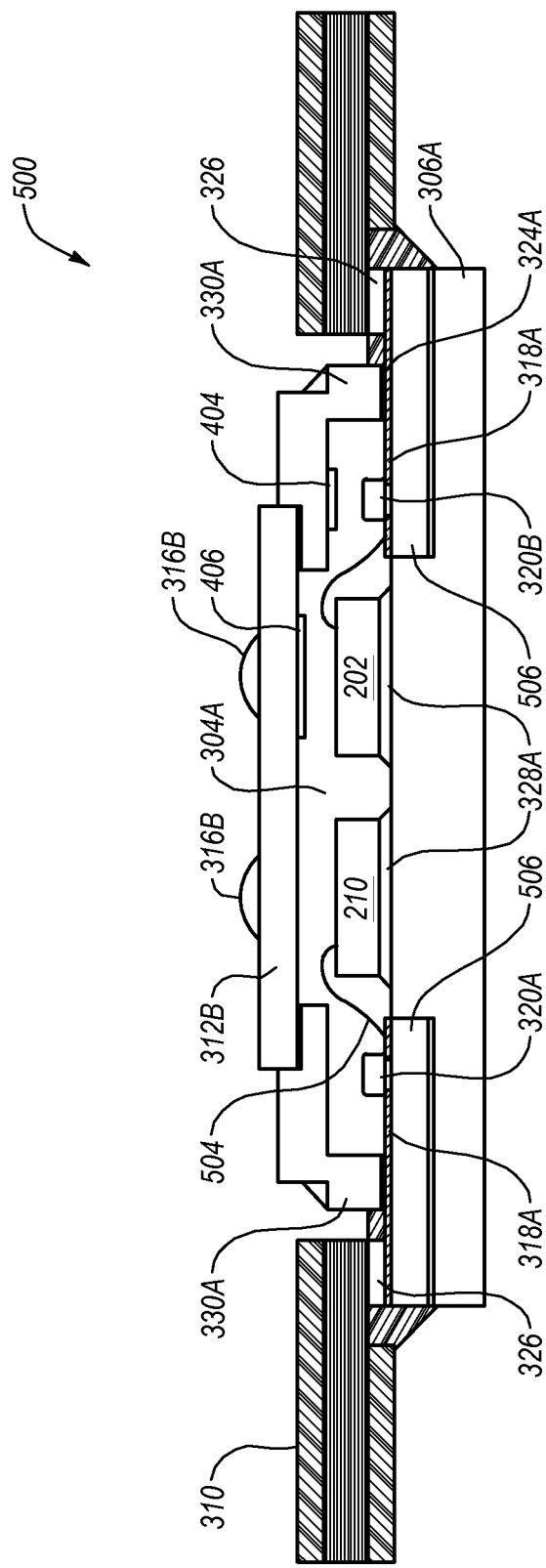
FIG. 5 is a detailed view of another example embodiment of an optoelectronic assembly.

FIG. 5 illustrates another example optoelectronic assembly 500 that may be implemented in the optoelectronic module 100 of FIGS. 1-2 and/or in other operating environments. In particular, the optoelectronic assembly 500 may include and/or correspond to one or both of the optical receiver 202 and the optical transmitter 210 of FIG. 2. The optoelectronic assembly 500 includes some components that are similar or identical to components illustrated in and described with respect to FIGS. 3-4 and such components are identified in FIG. 5 using the same numbering. A discussion of some or all of these components may be omitted in the discussion of FIG. 5 for brevity.

The optical transmitter 210 and the optical receiver 202 are disposed on a first component 306A, generally corresponding to the first component 306 in FIGS. 3-4. In this embodiment, additional glass components 506 are disposed on the first component 306A between the first component 306A and a third component 330A generally corresponding to the third component 330 in FIGS. 3-4. A glass component 312B, generally corresponding to the glass component 312 in FIG. 3 and/or the glass component 312A in FIG. 4, may be disposed on the third component 330A. The first component 306A may be spaced apart from the glass component 312B by the third component 330A. The first component 306A, the additional glass components 506, the third component 330A, and the glass component 312B may collectively form a housing of the optoelectronic assembly 500, the housing defining a cavity 304A, generally corresponding to the cavity 304 in FIGS. 3-4, inside which the optical receiver 202 and the optical transmitter 210 are disposed.

Conductive traces 318A, that generally correspond to the conductive traces 318 in FIGS. 3-4, are disposed on the additional glass components 506 and are electrically coupled to one or more wire bonds 504, which are electrically coupled to the optical receiver 202 and the optical transmitter 210. FIG. 5 additionally illustrates two electronic components 320A and 320B located inside of the cavity 304A and electrically coupled to the conductive traces 318A. The electronic components 320A and 320B may generally correspond to the electronic component 320 of FIGS. 3-4. The inclusion of the electronic components 320A and 320B in FIG. 5 is merely intended to illustrate that one or more electronic components may be included in the cavity 304A of the optoelectronic assembly 500.

In these and other embodiments, at least one of the conductive traces 318A may electrically couple the optical receiver 202 to a post-amplifier, such as the post-amplifier 204 of FIG. 2, located inside or outside of the cavity 304A. Analogously, at least one different one of the conductive traces 318A may electrically couple the optical transmitter 210 to a laser driver, such as the laser driver 208 of FIG. 2, located inside or outside of the cavity 304A. Lenses 316B generally corresponding to the lenses 316 of FIG. 3 and/or the lenses 316A of FIG. 4, are located on the glass component 312B. The lenses 316A may be attached to the glass component 312B or integrally formed therein as already discussed with respect to FIGS. 3-4. Depending on the application, the lenses 316B of FIG. 5 may be actively aligned or passively aligned using any suitable optoelectronic fabrication techniques. The optical transmitter 210 may be oriented to emit optical signals through the glass component 312B and one of the lenses 316B. Additionally or alternatively, the optical receiver 202 may be oriented to receive optical signals through the other of the lenses 316B and the glass component 312B.

The optical transmitter 210 and the optical receiver 202 may be disposed on and/or coupled to the first component 306A using any one of multiple semiconductor fabrication techniques or other suitable techniques. For example, the optical transmitter 210 and the optical receiver 202 may each be attached to the first component 306A with a mechanical coupler 328A that may generally be similar or identical to the mechanical coupler 328 of FIGS. 3-4. The mechanical coupler 328A may also thermally couple the optical transmitter 210 and the optical receiver 202 to the first component 306A such that the first component 306A functions as a heat sink for heat generated by the optical transmitter 210 and the optical receiver 202 during operation. Alternatively or additionally, the optical transmitter 210 and the optical receiver 202 may be formed onto or otherwise coupled to the first component 306A using semiconductor fabrication techniques or other suitable techniques.

The additional glass components 506 may be mechanically coupled to one or both of the first component 306A or the third component 330A using a mechanical coupler 324A that may generally be similar or identical to the mechanical coupler 324 of FIGS. 3-4.

The first component 306A, the glass component 312B, the third component 330A, and the additional glass components 506 may form, for example, a hermetic or semi-hermetic housing defining the cavity 304A. The optical receiver 202, the optical transmitter 210 and the electronic components 320A, 320B may be sealed inside of the cavity 304A to improve reliability of the optoelectronic module 100.

In FIGS. 3-5, each of the optoelectronic assemblies 300, 400, 500 includes both the optical transmitter 210 and the optical receiver 202. In other embodiments, one of the optical transmitter 210 and the optical receiver 202 may be omitted from the optoelectronic assembly 300, 400, 500.

In this description and the appended claims, the singular forms "a," "an," and "the" include plural referents unless the context clearly dictates otherwise. Thus, for example, reference to "a component surface" includes reference to one or more of such surfaces. The term "substantially" means that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

Aspects of the present disclosure may be embodied in other forms without departing from its spirit or essential characteristics. The described embodiments are to be considered in all respects illustrative and not restrictive. The claimed subject matter is indicated by the appended claims rather than by the foregoing description. All changes which come within the meaning and range of equivalency of the claims are to be embraced within their scope.

What is claimed is:

1. An optoelectronic assembly, comprising:
   a housing that defines a cavity, wherein the housing comprises a first component and a glass component disposed on an opposite side of the cavity from the first component, and wherein the glass component includes a first surface and a second surface;
   a lens located on the first surface of the glass component;
   an optical transmitter positioned within the cavity and oriented to emit optical signals through the glass component and the lens;
   an optical receiver positioned within the cavity;
   a plurality of conductive traces located on the second surface of the glass component; and
   an electronic component coupled to the conductive traces;
   a printed circuit board (PCB) positioned against the glass component and electrically coupled to the conductive traces with an electrical coupler extending from the conductive traces to an interior layer inside of the PCB;
   wherein a first side of the optical transmitter is electrically coupled to the conductive traces and an oppositely positioned second side is mechanically coupled to the first component; and
   wherein a first side of the optical receiver is electrically coupled to the conductive traces and an oppositely positioned second side is mechanically coupled to the first component.

2. The optoelectronic assembly of claim 1, wherein the first component comprises a metal with a coefficient of thermal expansion less than 20 ppm/° C.

3. The optoelectronic assembly of claim 1, wherein the first component comprises a nickel-cobalt ferrous alloy.

4. The optoelectronic assembly of claim 1, wherein at least one of the conductive traces includes a first portion located within the cavity and a second portion located outside of the cavity.

5. The optoelectronic assembly of claim 4, wherein the at least one of the conductive traces electrically couples at least one of the optical transmitter, the optical receiver or at least one of the electronic components to circuitry external to the cavity.

6. The optoelectronic assembly of claim 1, wherein the cavity is hermetically sealed or semi-hermetically sealed.

7. The optoelectronic assembly of claim 1, wherein the first surface of the glass component includes an etched feature for waveguide alignment.

8. The optoelectronic assembly of claim 1, wherein the first component and the glass component are substantially parallel to each other, and wherein the housing further comprises a third component that spaces the first component and the glass component apart from each other, further wherein the first component and the third component are laser welded together.

9. The optoelectronic assembly of claim 8, wherein the first and third components each comprise a metal or metal alloy, the optoelectronic assembly further comprising glass frit that mechanically couples the glass component to the third component.

10. The optoelectronic assembly of claim 8, wherein the first and third components comprise a metal or metal alloy, the optoelectronic assembly further comprising benzocyclobutene (BCB) epoxy that mechanically couples the glass component to the third component.

11. The optoelectronic assembly of claim 1, further comprising a getter disposed within the cavity.

12. The optoelectronic assembly of claim 11, wherein the getter comprises at least one of a metal or a polymer.

13. The optoelectronic assembly of claim 1, further comprising a film coupled to the glass component in an optical path of the optical transmitter, wherein the optical path passes through the film and the lens and wherein the film is configured to filter optical signals that pass through the film.

14. An optoelectronic module, comprising:
an optoelectronic assembly that includes:
a housing that defines a cavity, wherein the housing comprises a first component and a glass component disposed on an opposite side of the cavity from the first component, and wherein the glass component includes a first surface and a second surface;
a lens located on the first surface of the glass component;
an optical transmitter positioned within the cavity and oriented to emit optical signals through the glass component and the lens;
an optical receiver positioned within the cavity;
a plurality of conductive traces located on the second surface of the glass component and electrically coupled to the optical transmitter and the optical receiver, wherein at least one of the conductive traces includes a first portion located within the cavity and a second portion located outside of the cavity; and
an electronic component coupled to at least one of the plurality of conductive traces; and
a printed circuit board (PCB) positioned directly against the glass component and electrically coupled to the second portion of the at least one of the conductive traces located outside of the cavity with an electrical coupler extending from the second portion of the at least one of the conductive traces to an interior layer inside of the PCB;
wherein a first side of the optical transmitter or the optical receiver is electrically coupled to the conductive traces and an oppositely positioned second side of the optical transmitter or the optical receiver is mechanically coupled to the first component.

15. The optoelectronic module of claim 14, wherein the at least one of the conductive traces electrically couples at least one of the optical transmitter, the optical receiver or the electronic component to the PCB.

16. The optoelectronic module of claim 14, further comprising a solder joint that couples the PCB to the second portion of the at least one of the conductive traces located outside of the cavity.

17. The optoelectronic module of claim 14, wherein the cavity is hermetically sealed or semi-hermetically sealed.

18. The optoelectronic module of claim 14, further comprising a getter disposed within the cavity.

19. The optoelectronic module of claim 14, wherein the first component and the glass component are substantially parallel to each other, the housing further comprising a third component that spaces the first component and the glass component apart from each other.

20. An optoelectronic assembly, comprising:
a first component and a glass component that define a cavity;
a lens located on a first surface of the glass component;
an optoelectronic component positioned within the cavity, the optoelectronic component comprising an optical transmitter or an optical receiver;
conductive traces located on a second surface of the glass component;
an electronic component coupled to the conductive traces;
a printed circuit board (PCB) positioned against the glass component; and
an electrical coupler extending from the conductive traces to an interior layer inside of the PCB;
wherein a first side of the optoelectronic component is electrically coupled to the conductive traces and an oppositely positioned second side of the optoelectronic component is mechanically coupled to the first component.

* * * * *